(12) United States Patent
Cho

(10) Patent No.: US 12,598,792 B2
(45) Date of Patent: Apr. 7, 2026

(54) SEMICONDUCTOR STRUCTURE AND METHOD FOR MANUFACTURING THE SAME WHICH INCREASES THE CHANNEL LENGTH

(71) Applicant: CHANGXIN MEMORY TECHNOLOGIES, INC., Hefei City (CN)

(72) Inventor: Gyuseog Cho, Hefei (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 471 days.

(21) Appl. No.: 18/176,612

(22) Filed: Mar. 1, 2023

(65) Prior Publication Data

US 2024/0030289 A1      Jan. 25, 2024

Related U.S. Application Data

(63) Continuation of application No. PCT/CN2022/117031, filed on Sep. 5, 2022.

(30) Foreign Application Priority Data

Jul. 22, 2022    (CN) .......................... 202210872127.7

(51) Int. Cl.
*H10D 30/60* (2025.01)
*H01L 21/762* (2006.01)
(Continued)

(52) U.S. Cl.
CPC ..... *H10D 62/235* (2025.01); *H01L 21/76224* (2013.01); *H10D 30/603* (2025.01);
(Continued)

(58) Field of Classification Search
CPC ............. H10D 62/292; H10D 84/0128; H10D 84/0167; H10D 30/6757; H10D 30/0245; H10D 30/0221; H10D 30/603
See application file for complete search history.

(56) References Cited

U.S. PATENT DOCUMENTS 3,953,879 A * 4/1976 O'Connor-d'Arlach ....................
H10D 99/00
257/271
4,393,391 A * 7/1983 Blanchard ............ H10D 64/513
257/E29.05
(Continued)

FOREIGN PATENT DOCUMENTS

CN 101452954 A 6/2009
CN 102130171 A 7/2011
(Continued)

OTHER PUBLICATIONS

International Search Report in the international application No. PCT/CN2022/117031, mailed on Dec. 19, 2022, 3 pages.

*Primary Examiner* — Maliheh Malek
(74) *Attorney, Agent, or Firm* — Syncoda LLC; Feng Ma

(57) ABSTRACT

A semiconductor structure is provided. The semiconductor structure includes a substrate and a gate. The substrate has an active region which includes a first doped region, a channel region and a second doped region arranged along a first direction. The gate includes a first conductive portion and at least two second conductive portions contacted with and connected to the first conductive portion, the first conductive portion is located above an upper surface of the substrate, the second conductive portions are located below the upper surface of the substrate, adjacent second conductive portions are arranged at intervals along the first direction, and the channel region surrounds sidewalls and a bottom surface of each of the second conductive portions. A
(Continued)

method for manufacturing a semiconductor structure is also provided.

13 Claims, 6 Drawing Sheets

(51) Int. Cl.
  *H10D 30/01* (2025.01)
  *H10D 62/17* (2025.01)
  *H10D 64/27* (2025.01)
(52) U.S. Cl.
  CPC ......... *H10D 62/292* (2025.01); *H10D 64/519* (2025.01); *H10D 30/0221* (2025.01)

(56) References Cited

U.S. PATENT DOCUMENTS

| | | | | | |
|---|---|---|---|---|---|
| 4,697,201 | A | * | 9/1987 | Mihara | H10D 30/668 257/330 |
| 4,796,070 | A | * | 1/1989 | Black | H10D 30/65 257/E29.021 |
| 4,939,100 | A | * | 7/1990 | Jeuch | H10D 64/027 257/E21.429 |
| 5,502,322 | A | * | 3/1996 | Jung | H10D 30/60 257/330 |
| 6,031,261 | A | * | 2/2000 | Kang | H01L 21/26533 257/E21.426 |
| 6,358,800 | B1 | * | 3/2002 | Tseng | H10D 64/018 257/E21.429 |
| 6,436,765 | B1 | * | 8/2002 | Liou | H10B 69/00 438/315 |
| 6,465,842 | B2 | * | 10/2002 | Nishinohara | H10D 64/017 257/E21.429 |
| 6,509,234 | B1 | * | 1/2003 | Krivokapic | H10D 30/6739 438/572 |
| 6,960,507 | B2 | * | 11/2005 | Kim | H10D 30/026 438/156 |
| 7,122,431 | B2 | * | 10/2006 | Kim | H10D 84/0128 257/E21.426 |
| 7,285,466 | B2 | * | 10/2007 | Kim | H10D 30/791 257/E21.429 |
| 7,394,116 | B2 | * | 7/2008 | Kim | H10D 64/017 257/213 |
| 7,432,162 | B2 | * | 10/2008 | Chung | H10D 30/6728 257/E21.429 |
| 7,579,656 | B2 | * | 8/2009 | Kang | H10D 30/62 257/E29.112 |
| 7,667,266 | B2 | * | 2/2010 | Jung | H10D 84/0142 257/334 |
| 7,691,689 | B2 | * | 4/2010 | Jang | H10B 63/10 438/157 |
| 7,816,208 | B2 | * | 10/2010 | Kujirai | H01L 21/76232 257/E21.384 |

| | | | | | |
|---|---|---|---|---|---|
| 8,846,490 | B1 | * | 9/2014 | Shieh | H10D 84/834 438/424 |
| 9,006,067 | B2 | * | 4/2015 | Kang | H10D 84/0158 257/329 |
| 9,024,328 | B2 | * | 5/2015 | Bolotnikov | H10D 12/031 438/510 |
| 9,214,358 | B1 | * | 12/2015 | Lin | H10D 84/0135 |
| 9,406,521 | B1 | * | 8/2016 | Liou | H10D 84/038 |
| 9,837,282 | B1 | * | 12/2017 | Weng | H01L 22/12 |
| 9,899,388 | B2 | * | 2/2018 | Kim | H10D 84/0188 |
| 9,960,083 | B1 | * | 5/2018 | Chen | H10D 84/853 |
| 10,283,415 | B2 | * | 5/2019 | Hsu | H01L 21/3085 |
| 10,381,262 | B2 | * | 8/2019 | Cheng | H10D 84/0151 |
| 10,396,205 | B2 | * | 8/2019 | Kim | H10D 84/0151 |
| 10,461,191 | B2 | * | 10/2019 | Huang | H10B 12/36 |
| 10,727,335 | B2 | | 7/2020 | Amari | |
| 10,777,466 | B2 | * | 9/2020 | Huang | H01L 21/02183 |
| 11,056,593 | B2 | * | 7/2021 | Manipatruni | H10D 64/017 |
| 2004/0155296 | A1 | * | 8/2004 | Kim | H10D 84/038 257/E21.426 |
| 2004/0207008 | A1 | * | 10/2004 | Hadizad | H10D 30/668 257/E29.066 |
| 2007/0134884 | A1 | * | 6/2007 | Kim | H10D 84/038 438/618 |
| 2008/0224206 | A1 | * | 9/2008 | Oh | H10D 64/018 257/E21.426 |
| 2011/0156136 | A1 | * | 6/2011 | Amari | H10D 64/027 257/E21.409 |
| 2013/0309838 | A1 | * | 11/2013 | Wei | H01L 21/76229 257/E21.546 |
| 2014/0227848 | A1 | * | 8/2014 | Kang | H10D 84/0151 438/283 |
| 2015/0102402 | A1 | | 4/2015 | Amari | |
| 2016/0225674 | A1 | * | 8/2016 | Jacob | H10D 84/0188 |
| 2017/0092762 | A1 | | 3/2017 | Amari | |
| 2017/0330967 | A1 | | 11/2017 | Amari | |
| 2018/0122705 | A1 | * | 5/2018 | Chen | H10D 64/667 |
| 2018/0240908 | A1 | | 8/2018 | Amari | |
| 2018/0308746 | A1 | * | 10/2018 | Hu | H01L 21/3086 |
| 2019/0043760 | A1 | * | 2/2019 | Hsu | H01L 21/76224 |
| 2019/0097054 | A1 | * | 3/2019 | Kim | H10D 30/024 |
| 2019/0348516 | A1 | * | 11/2019 | Ramaswamy | H10D 84/038 |
| 2020/0161306 | A1 | * | 5/2020 | Seo | H10B 12/34 |
| 2020/0303546 | A1 | | 9/2020 | Amari | |
| 2021/0159325 | A1 | * | 5/2021 | Hsu | H01L 21/32135 |
| 2021/0296496 | A1 | | 9/2021 | Amari | |
| 2023/0017879 | A1 | * | 1/2023 | Li | H10D 84/83 |
| 2023/0275156 | A1 | * | 8/2023 | You | H10D 64/021 257/288 |

FOREIGN PATENT DOCUMENTS

| | | |
|---|---|---|
| CN | 111785638 A | 10/2020 |
| CN | 112071758 A | 12/2020 |
| CN | 110164970 B | 5/2022 |
| KR | 20050063317 A | 6/2005 |

* cited by examiner

SEMICONDUCTOR STRUCTURE AND METHOD FOR MANUFACTURING THE SAME WHICH INCREASES THE CHANNEL LENGTH

CROSS-REFERENCE TO RELATED APPLICATIONS

This application is a continuation application of International Patent Application No. PCT/CN2022/117031, filed on Sep. 5, 2022 and entitled "SEMICONDUCTOR STRUCTURE AND METHOD FOR MANUFACTURING SAME", which claims priority to Chinese Patent Application No. 202210872127.7, filed on Jul. 22, 2022. The disclosures of International Patent Application No. PCT/CN2022/117031 and Chinese Patent Application No. 202210872127.7 are hereby incorporated by reference in their entireties.

BACKGROUND

Memory is a memory component used to store programs and various data information. Random Access Memory (RAM) used in general computer systems may be divided into Dynamic Random Access Memory (DRAM) and Static Random-Access Memory (SRAM). DRAM is a semiconductor memory device commonly used in computers, and is composed of many repetitive memory cells.

A memory cell usually includes a transistor which includes a source, a gate and a drain. However, with the continuous shrinkage of a semiconductor structure, a structure of a corresponding transistor also continues to shrink, resulting in shortening of a length of a channel region correspondingly, which will affect performance of the semiconductor structure.

SUMMARY

Embodiments of the disclosure relate to the field of semiconductors, and in particular to a semiconductor structure and a method for manufacturing the same.

The embodiments of the disclosure provide a semiconductor structure and a method for manufacturing the same, which may at least increase a channel length of the semiconductor structure.

According to a first aspect of the disclosure, there is provided a semiconductor structure including a substrate and a gate. The substrate has an active region which includes a first doped region, a channel region and a second doped region arranged along a first direction. The gate includes a first conductive portion and at least two second conductive portions contacted with and connected to the first conductive portion, the first conductive portion is located above an upper surface of the substrate, the second conductive portions are located below the upper surface of the substrate, adjacent second conductive portions are arranged at intervals along the first direction, and the channel region surrounds sidewalls and a bottom surface of each of the second conductive portions.

In some embodiments, a projection of the first conductive portion on a surface of the substrate may partially coincide with a projection of the first doped region on the surface of the substrate and may partially coincide with a projection of the second doped region on the surface of the substrate, and a projection of each of the second conductive portions on the surface of the substrate is located between the projection of the first doped region on the surface of the substrate and the projection of the second doped region on the surface of the substrate.

In some embodiments, along the first direction, a width of each of the second conductive portions may be identical.

In some embodiments, in a direction perpendicular to a surface of the substrate, heights of several of the second conductive portions may be identical.

In some embodiments, along the first direction, heights of several of the second conductive portions may be sequentially increased.

In some embodiments, along the first direction, widths of the adjacent second conductive portions may be sequentially decreased.

In some embodiments, in a direction perpendicular to a surface of the substrate, a height of each of the second conductive portions may be identical to a height of a corresponding part of the first conductive portion contacted with the second conductive portion.

In some embodiments, the semiconductor structure may further include an insulating structure located in the active region and located between the adjacent second conductive portions.

In some embodiments, along the first direction, a width of the insulating structure may be less than or equal to one-third of a spacing between the second conductive portions.

In some embodiments, in a direction perpendicular to a surface of the active region, a spacing between a top surface of the insulating structure and the first conductive portion may be greater than or equal to one-fifth of a thickness of each of the second conductive portions.

In some embodiments, the insulating structure located between the adjacent second conductive portions may include multiple insulating structures arranged at intervals.

In some embodiments, each of the second conductive portions may include a first sub-conductive portion and a second sub-conductive portion, the first sub-conductive portions are arranged in the substrate at intervals, the second sub-conductive portion is located between adjacent first sub-conductive portions and is also located between adjacent insulating structures, and along the first direction, a width of the first sub-conductive portion is greater than that of the second sub-conductive portion, and a bottom surface of the second sub-conductive portion is lower than a top surface of the insulating structure.

In some embodiments, the semiconductor structure may further include a gate dielectric layer located between the gate and the substrate.

In some embodiments, the semiconductor structure may further include a protective layer covering a top surface and sidewalls of the gate.

According to a second aspect of the disclosure, there is provided a method for manufacturing a semiconductor structure, including the following operations. A substrate is provided, the substrate has an active region which includes a first doped region, a channel region and a second doped region arranged along a first direction. A gate is formed, the gate includes a first conductive portion and at least two second conductive portions contacted with and connected to the first conductive portion, the first conductive portion is located above the substrate, the second conductive portions are located below an upper surface of the substrate, adjacent second conductive portions are arranged at intervals along the first direction, and the channel region surrounds sidewalls and a bottom surface of each of the second conductive portions.

In some embodiments, the operation of forming the gate may include the following operations. The active region is patterned to form spaced grooves in the active region. The gate is formed, so that each of the grooves is filled with a respective one of the second conductive portions, and the first conductive portion is located on a surface of the active region.

In some embodiments, the method for manufacturing the semiconductor structure may further include the following operations before forming the gate. An insulating structure is formed, the insulating structure is located in the active region. The gate is formed, so that the insulating structure is located between the adjacent second conductive portions, a top surface of the insulating structure is higher than the bottom surface of each of the second conductive portions and is lower than a bottom surface of the first conductive portion.

BRIEF DESCRIPTION OF THE DRAWINGS

One or more embodiments are exemplarily explained by figures in the corresponding drawings which are not intended to limit the embodiments, and the figures in the drawings do not constitute a limitation of scale, unless specifically stated. In order to more clearly explain the embodiments of the disclosure or technical solutions in conventional techniques, the drawings required to be used in the embodiments will be briefly described below, and it is apparent that the drawings as described below are only some of the embodiments of the disclosure, from which other drawings may be obtained by those of ordinary skill in the art without paying any creative effort.

DETAILED DESCRIPTION

An embodiment of the disclosure provides a semiconductor structure. By arranging a gate to include a first conductive portion and at least two second conductive portions, the second conductive portions located below an upper surface of the substrate, and adjacent second conductive portions spaced apart from each other along a first direction, a facing area between the gate and an active region may be increased, that is to say, a facing area between a channel region and the gate is increased, so that a total length of the channel region may be increased, thereby avoiding too short total length of the channel region of the semiconductor due to shrinkage of the semiconductor structure, avoiding deterioration of a turn-off capability of the semiconductor structure and avoiding a situation where a threshold voltage decreases.

Embodiments of the disclosure will be described in detail below with reference to the drawings. However, those of ordinary skill in the art will appreciate that in various embodiments of the disclosure, numerous technical details have been presented in order to enable the reader to understand the disclosure better. However, even without these technical details and various variations and modifications based on the following embodiments, the technical solutions of the disclosure may be implemented.

Figure 1:
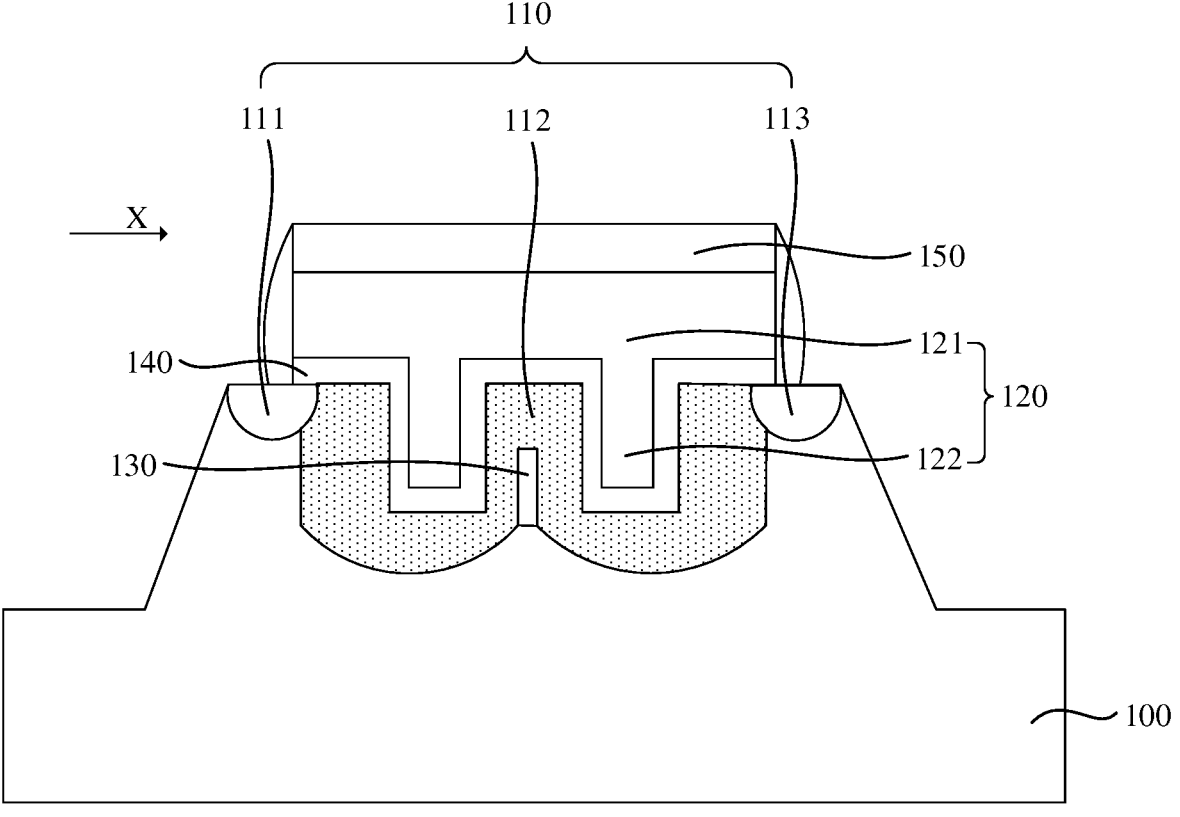
FIG. 1 is a schematic structural diagram of a semiconductor structure provided by an embodiment of the disclosure.
Figure 2:
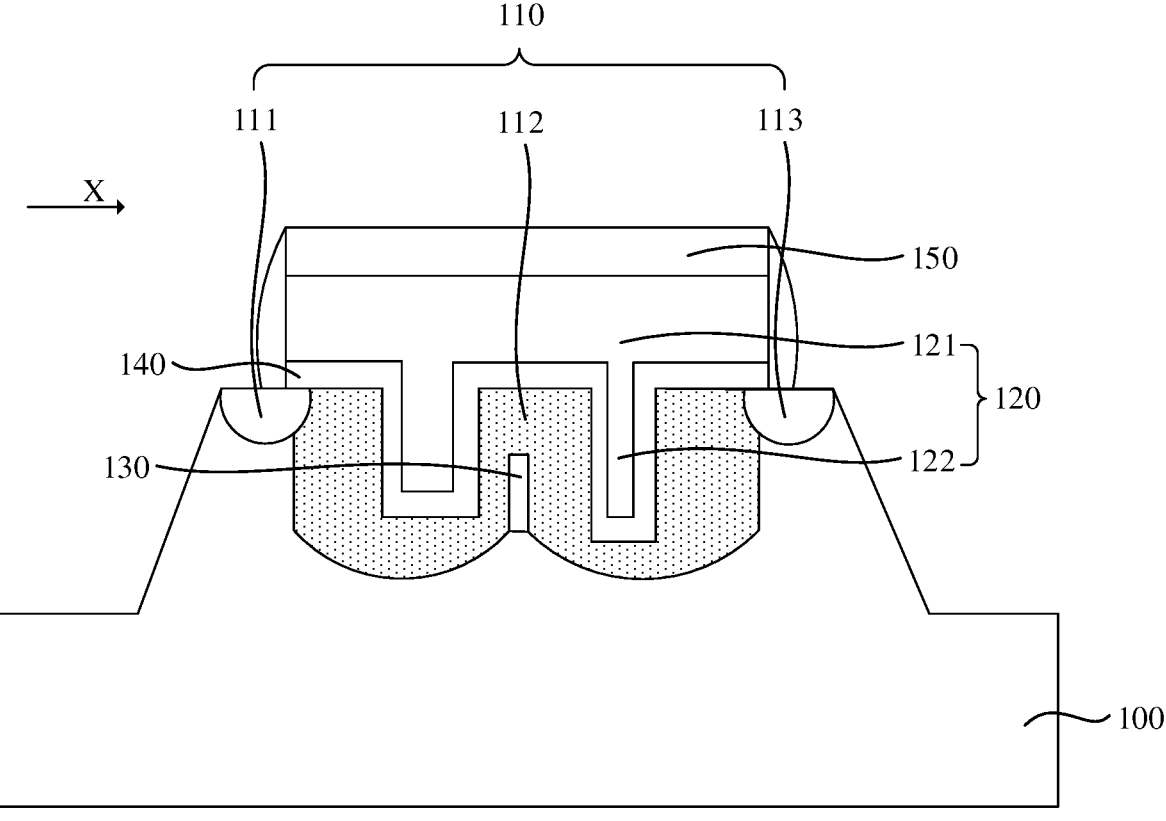
FIG. 2 is a schematic structural diagram of another semiconductor structure provided by an embodiment of the disclosure.
Figure 3:
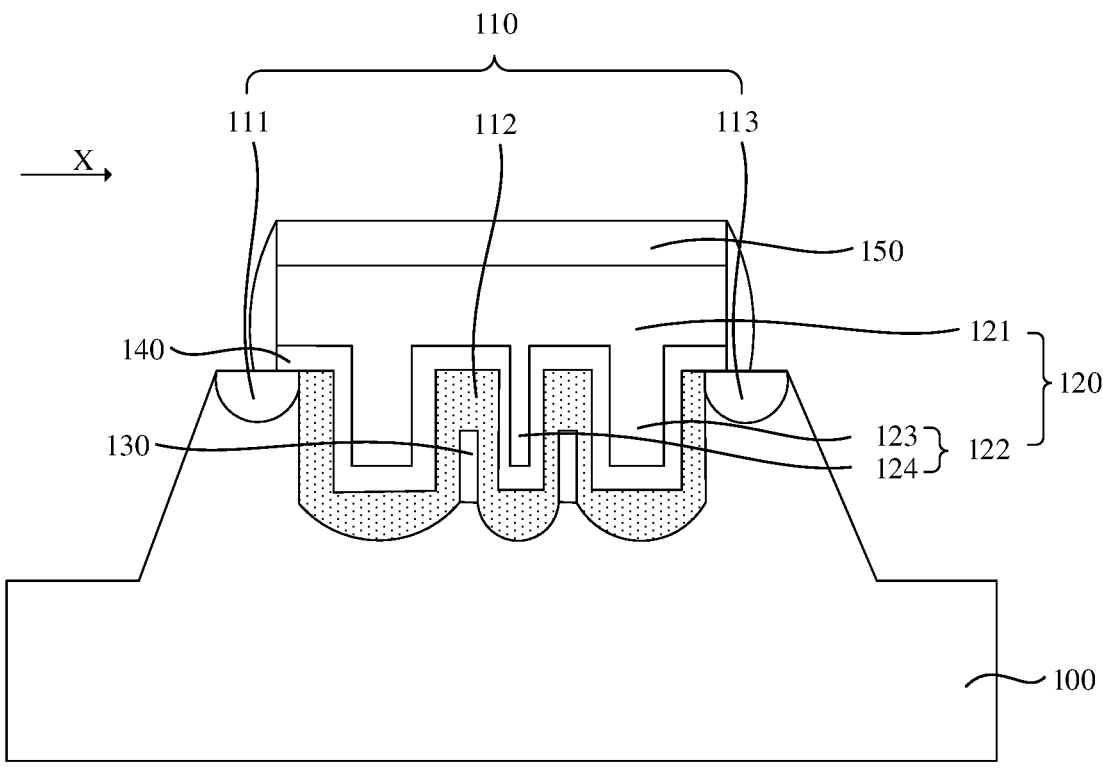
FIG. 3 is a schematic structural diagram of still another semiconductor structure provided by an embodiment of the disclosure.

Referring to FIG. 1 to FIG. 3, FIG. 1 is a schematic diagram of a semiconductor structure provided by an embodiment of the disclosure, FIG. 2 is a schematic structural diagram of another semiconductor structure provided by an embodiment of the disclosure, and FIG. 3 is a schematic structural diagram of still another semiconductor structure provided by an embodiment of the disclosure.

Specifically, referring to FIG. 1, a semiconductor structure includes a substrate 100 and a gate 120. The substrate 100 has an active region 110, and the active region 110 includes a first doped region 111, a channel region 112 and a second doped region 113 arranged along a first direction X. The gate 120 includes a first conductive portion 121 and at least two second conductive portions 122, the second conductive portions 122 are contacted with and connected to the first conductive portion 121, the first conductive portion 121 is located above an upper surface of the substrate 100, the second conductive portions 122 are located below the upper surface of the substrate 100, adjacent second conductive portions 122 are arranged at intervals along the first direction X, and the channel region 112 surrounds sidewalls and a bottom surface of each of the second conductive portions 122. By arranging at least two second conductive portions 122 to be located below the surface of the substrate 100, a facing area between the gate 120 and the active region 110 may be increased, and by arranging a channel region 112 to surround sidewalls and a bottom surface of each of the second conductive portions 122, a total length of the channel region 112 may be increased, thereby avoiding a problem that the channel is too short due to increase of integration level of the semiconductor structure, and thus avoiding deterioration of a turn-off capability of the semiconductor structure and avoiding a situation where a threshold voltage decreases.

In some embodiments, material of the substrate 100 may be silicon, germanium or silicon germanium, and the material of the substrate 100 may also be doped. Taking the material of the substrate 100 being silicon as an example, a P-type substrate may be formed in a case that the substrate 100 is doped with a trace amount of trivalent elements, such as boron, indium, gallium, aluminum, or the like. Similarly, an N-type substrate may be formed in a case that the substrate 100 is doped with a trace amount of pentavalent elements, such as phosphorus, antimony, arsenic, or the like. Selection of elements to be doped in the substrate 100 may be considered according to actual requirements, product properties and other aspects. The disclosure does not limit the material and doped elements of the substrate 100.

In some embodiments, the first doped region 111 may serve as a source of the semiconductor structure and the second doped region 113 may serve as a drain of the semiconductor structure. In other embodiments, the first doped region 111 serves as a drain of the semiconductor structure and the second doped region 113 serves as a source of the semiconductor structure.

In some embodiments, doped ions of the first doped region 111 are the same as doped ions of the second doped region 113, and the doped ions of the first doped region 111 and the doped ions of the second doped region 113 may be opposite to doped ions of the substrate 100. For example, the substrate 100 is a P-type substrate, and the doped ions of the first doped region 111 and the doped ions of the second doped region 113 may be N-type doped ions. Or, the substrate 100 is an N-type substrate, and the doped ions of the first doped region 111 and the doped ions of the second doped region 113 may be P-type doped ions.

In some embodiments, the semiconductor structure may be an NPN-type structure. That is to say, the substrate 100 is a P-type substrate, and the doped ions of the first doped region 111 and the doped ions of the second doped region 113 are N-type doped ions. In other embodiments, the semiconductor structure is a PNP-type structure. That is to say, the substrate 100 is an N-type substrate, and the doped ions of the first doped region 111 and the doped ions of the second doped region 113 are P-type doped ions.

The gate 120 controls whether the first doped region 111 and the second doped region 113 are turned on. In a case that the gate 120 has no voltage, no current flows between the first doped region 111 and the second doped region 113, that is, the semiconductor structure is in a cut-off state. In a case that a positive voltage is supplied to the gate 120, taking the semiconductor structure being an NPN-type structure as an example, negative electrons of the first doped region 111 and the second doped region 113 are attracted and flow to the gate 120. However, since the gate 120 is not in direct contact with the active region 110, the electrons converge between the first doped region 111 and the second doped region 113 and thus form a current, and the first doped region 111 and the second doped region 113 are turned on. A part of the active region 110, which is a region for converging carriers, is called the channel region 112. It may be understood that when the channel region 112 is too short, a voltage required for the gate 120 to control turn-on of the first doped region 111 and the second doped region 113 will decrease, that is, a threshold voltage will decrease, which results in degradation of performance of the semiconductor structure.

The first conductive portion 121 and the second conductive portion 122 are contacted and connected together to form a one-piece structure. When the gate 120 controls turn-on of the first doped region 111 and the second doped region 113, carriers converge on a surface of the first conductive portion 121 facing the substrate 100 and a surface of the second conductive portion 122 facing the substrate 100. That is to say, by arranging the second conductive portion 122, a length of the channel region 112 may be increased, thereby avoiding a problem that the threshold voltage decreases due to too short length of the channel region 112, and thus improving reliability of the semiconductor structure.

In some embodiments, a projection of the first conductive portion 121 on a surface of the substrate 100 partially coincides with a projection of the first doped region 111 on the surface of the substrate 100, and the projection of the first conductive portion 121 on the surface of the substrate 100 partially coincides with a projection of the second doped region 113 on the surface of the substrate 100, and a projection of each of the second conductive portions 122 on the surface of the substrate 100 is located between the projection of the first doped region 111 on the surface of the substrate 100 and the projection of the second doped region 113 on the surface of the substrate 100. In other words, a part of the first conductive portion 121 is also located on top surfaces of the first doped region 111 and the second doped region 113, and the second conductive portion 122 is located between the first doped region 111 and the second doped region 113. By arranging the second conductive portion 122 to be between the first doped region 111 and the second doped region 113, a total length of the channel region 112 between the first doped region 111 and the second doped region 113 may be increased, thereby avoiding the problem that the threshold voltage decreases due to too short length of the channel region 112, and thus improving reliability of the semiconductor structure.

It may be understood that the total length of the channel region 112 is a sum of a length of a bottom surface of the first conductive portion 121 facing the active region 110, lengths of sidewalls of the second conductive portion 122 facing the active region 110, and a length of the bottom surface of the second conductive portion 122 facing the active region 110. The more the number of the second conductive portions 122, the longer the corresponding total length of the channel region 112.

In some embodiments, along the first direction X, a width of each of the second conductive portions 122 is identical. In some embodiments, the second conductive portion 122 has a regular pattern, such as a cuboid, a cube, or the like. The width of each of the second conductive portions 122 being identical means that a corresponding size of each of the second conductive portions 122 is identical along the first direction X. In other embodiments, the second conductive portion has an irregular pattern. The width of each of the second conductive portions 122 being identical means that the width of each of the second conductive portions 122 is identical on the same horizontal line.

In some embodiments, the width of the second conductive portion 122 is 10 nm to 50 nm. It may be understood that when the width of the second conductive portion 122 is less than 10 nm, there is less performance improvement of the semiconductor structure caused by increasing the number of the second conductive portions 122. When the width of the second conductive portion 122 is greater than 50 nm, the width of the second conductive portion 122 is too wide, resulting in corresponding decrease of spacing between adjacent second conductive portions 122, thereby resulting in increase of parasitic capacitance between adjacent second conductive portions 122, and thus affecting performance of the semiconductor structure.

In some embodiments, the width of the second conductive portion 122 gradually decreases in a direction perpendicular to the surface of the substrate 100. In other words, a structure of the second conductive portion 122 is that a width of a side of the second conductive portion 122 away from the active region 110 is large, and a width of a side of the second conductive portion 122 close to the active region 110 is small. By forming a second conductive portion 122 whose width gradually decreases, difficulty of forming the semiconductor structure may be reduced. When a groove containing the second conductive portion 122 is formed, it is possible to form a groove whose width gradually decreases according to reaction of an etching liquid without controlling a mass percentage of a solute of the etching liquid. In other embodiments, the width of the second conductive portion gradually increases in a direction perpendicular to the surface of the substrate. In still other embodiments, the width of the second conductive portion may also vary irregularly. The disclosure does not limit the width of the second conductive portion 122, and the width of the second conductive portion 122 may be adjusted according to actual requirements and actual production processes.

In some embodiments, a spacing between adjacent second conductive portions 122 is less than two-third of a width of the first conductive portion 121, and is greater than one-tenth of the width of the first conductive portion. It may be understood that when the spacing between adjacent second conductive portions 122 is less than one-tenth of the width of the first conductive portion, the spacing between adjacent second conductive portions 122 is too small, resulting in more parasitic capacitances existing between adjacent second conductive portions 122, thereby resulting in degradation of performance of the semiconductor structure. When the spacing between adjacent second conductive portions 122 is greater than two-third of the width of the first conductive portion 121, a width of the gate 120 will be relatively large, which will result in a larger size of the semiconductor structure. In other embodiments, the spacing between adjacent second conductive portions may also vary, for example, along the first direction X, the spacing between the second conductive portions gradually increases or gradually decreases.

In some embodiments, when the width of the gate 120 is constant, the spacing between adjacent second conductive portions 122 is inversely proportional to the width of the second conductive portion 122. That is to say, the greater the spacing between adjacent second conductive portions 122, the smaller the width of the second conductive portion 122 correspondingly. Conversely, the smaller the spacing between the adjacent second conductive portions 122, the greater the width of the second conductive portion 122 correspondingly, thus it may be ensured that the width of the second conductive portion 122 and the spacing between adjacent second conductive portions 122 may be reasonably set under a condition that a volume of the semiconductor structure is relatively small.

In some embodiments, in a direction perpendicular to a surface of the substrate 100, heights of multiple second conductive portions 122 are identical. The height of the second conductive portion 122 is a depth at which the second conductive portion 122 extends into the active region 110. By arranging the heights of multiple second conductive portions 122 to be identical, problems caused by height differences between adjacent second conductive portions 122 may be avoided, thereby improving reliability of the semiconductor structure.

In some embodiments, the height of the second conductive portion 122 is greater than the width of the second conductive portion 122. That is to say, the height of the second conductive portion 122 in the direction perpendicular to the surface of the substrate 100 is greater than the width of the second conductive portion 122 along the first direction X. It may be understood that the second conductive portion 122 is located at the bottom of the first conductive portion 121, and the number and width of the second conductive portion 122 depend on the width of the first conductive portion 121 along the first direction X. By arranging the height of the second conductive portion 122 to be greater than the width of the second conductive portion 122, the length of the channel region 112 may be increased much while the second conductive portions 122 are arranged as many as possible. In other embodiments, the height of the second conductive portion may also be less than or equal to the width of the second conductive portion, which may be adjusted according to actual situations.

In some embodiments, along the first direction X, heights of multiple second conductive portions 122 are sequentially increased. It may be understood that the higher the height of the second conductive portion 122, the longer the corresponding increased length of the channel region 112. Therefore, the length of the channel region 112 may be increased by arranging heights of the second conductive portions 122 to be sequentially increased. In other embodiments, the heights of multiple second conductive portions are sequentially decreased along the first direction.

In some embodiments, along the first direction X, widths of adjacent second conductive portions 122 are sequentially decreased. It may be understood that the smaller the width of the second conductive portion 122, the more the providable number of the second conductive portions 122. By arranging widths of the second conductive portions 122 to be sequentially decreased, the number of the second conductive portions 122 may be increased, thereby increasing the length of the channel region 112. In some embodiments, along the first direction X, the heights of multiple second conductive portions 122 are sequentially increased and the widths of the second conductive portions 122 are sequentially decreased. By balancing the heights and widths of multiple second conductive portions 122, the number of parasitic capacitances on the second conductive portions 122 may be reduced, thereby improving reliability of the semiconductor structure. In other embodiments, the widths of adjacent second conductive portions may also be identical or sequentially increased along the first direction.

In some embodiments, the widths and heights of the second conductive portions 122 may also vary irregularly along the first direction X and may be adjusted according to actual production requirements and production processes.

In some embodiments, in a direction perpendicular to a surface of the substrate 100, a height of each of the second conductive portions 122 is identical to a height of a corresponding part of the first conductive portion 121 contacted with the second conductive portion 122. In other words, a height of a corresponding part of the first conductive portion 121 whose projection on a surface of the first conductive portion 121 coincides with a projection of the second conductive portion 122 on the surface of the first conductive portion 121 is equal to the height of the second conductive portion 122. By arranging the height of the second conductive portion 122 to be equal to the height of the corresponding part of the first conductive portion 121 contacted with the second conductive portion 122 in the direction perpendicular to the surface of the substrate 100, production processes may be facilitated. In a process of forming the gate 120, the first conductive portion 121 and the second conductive portion 122 are formed in the same operation. Since the second conductive portion 122 is located on the bottom surface of the first conductive portion 121, a part of the first conductive portion 121 which is contacted with the second conductive portion 122 is always lower than a part of the first conductive portion 121 which is not contacted with the second conductive portion 122. In subsequent processes, only the part of the first conductive portion 121 which is not contacted with the second conductive portion 122 may be removed by etching. In other embodiments, in the direction perpendicular to the surface of the substrate, the height of the second conductive portion may not be equal to the height of the corresponding part of the first conductive portion contacted with the second conductive portion.

In some embodiments, the semiconductor structure further includes an insulating structure 130 located in the active region 110. The insulating structure 130 is located between adjacent second conductive portions 122. It may be understood that the channel region 112 also covers sidewalls and a top surface of the insulating structure 130. By arranging the insulating structure 130, the length of the channel region 112 may be increased, thereby avoiding the problem that the threshold voltage decreases due to too short length of the channel region 112, and thus improving reliability of the semiconductor structure.

In some embodiments, along the first direction X, a width of the insulating structure 130 is less than or equal to one-third of a spacing between the second conductive portions 122. It may be understood that when the width of the insulating structure 130 is greater than one-third of the spacing between the second conductive portions 122, the gate 120 controls turn-on of the first doped region 111 and the second doped region 113. However, since the width of the insulating structure 130 is too large, the channel region 112 between the insulating structure 130 and the second conductive portion 122 is too narrow, thereby slowing down flow speeds of carriers, which will affect performance of the semiconductor structure. By arranging the width of the insulating structure 130 to be less than or equal to one-third of the spacing between the second conductive portions 122, the length of the channel region 112 may be increased while the channel region 112 is avoided from being too narrow.

In some embodiments, in a direction perpendicular to a surface of the active region 110, a spacing between a top surface of the insulating structure 130 and the first conductive portion 121 is greater than or equal to one-fifth of a thickness of each of the second conductive portions 122. It may be understood that when the spacing between the top surface of the insulating structure 130 and the first conductive portion 121 is less than one-fifth of the thickness of the second conductive portion 122, the gate 120 controls turn-on of the first doped region 111 and the second doped region 113. However, since the spacing between the top surface of the insulating structure 130 and the first conductive portion 121 is too small, the channel region 112 between the insulating structure 130 and the second conductive portion 122 is too narrow, thereby slowing down flow speeds of carriers, which will affect performance of the semiconductor structure. By arranging the spacing between the top surface of the insulating structure 130 and the first conductive portion 121 to be greater than or equal to one-fifth of the thickness of the second conductive portion 122, the length of the channel region 112 may be increased while the channel region 112 may be avoided from being too narrow.

In some embodiments, the insulating structure 130 located between adjacent second conductive portions 122 include multiple insulating structures, and multiple insulating structures 130 are arranged at intervals. That is to say, there are multiple insulating structures 130 between every two adjacent second conductive portions 122. It may be understood that the larger the number of insulating structures 130, the longer the length of the channel region 112 correspondingly. By arranging multiple insulating structures 130, the length of the channel region 112 may be increased, thereby avoiding the problem that the threshold voltage decreases due to too short length of the channel region 112, and thus improving reliability of the semiconductor structure.

In some embodiments, the number of insulating structures between adjacent second conductive portions 122 may or may not be equal. Taking the number of the second conductive portions 122 being three as an example, the second conductive portions 122 are divided into a 1$^{st}$ second conductive portion, a 2$^{nd}$ second conductive portion and a 3$^{rd}$ second conductive portion along the first direction. The number of insulating structures between the 1$^{st}$ second conductive portion and the 2$^{nd}$ second conductive portion is three for example, and the number of insulating structures between the 2$^{nd}$ second conductive portion and the 3$^{rd}$ second conductive portion may be three or not three. The disclosure does not limit the number of insulating structures 130 between adjacent second conductive portions 122, and the number of insulating structures 130 between adjacent second conductive portions 122 may be adjusted according to actual production processes and performance requirements of the semiconductor structure.

In some embodiments, each of the second conductive portions 122 includes a first sub-conductive portion 123 and a second sub-conductive portion 124, the first sub-conductive portions 123 are arranged in the substrate 100 at intervals, the second sub-conductive portion 124 is located between adjacent first sub-conductive portions 123, and along the first direction X, a width of the first sub-conductive portion 123 is greater than that of the second sub-conductive portion 124, and the second sub-conductive portion 124 is also located between adjacent insulating structures 130, and a bottom surface of the second sub-conductive portion 124 is lower than a top surface of the insulating structure 130. In other words, when there are multiple insulating structures 130, the second sub-conductive portion 124 may be arranged between adjacent insulating structures 130. By arranging the second sub-conductive portion 124 located between adjacent first sub-conductive portions 123, the length of the channel region 112 may be increased, thereby avoiding the problem that the threshold voltage decreases due to too short length of the channel region 112, and thus improving reliability of the semiconductor structure.

In some embodiments, the semiconductor structure further includes a gate dielectric layer 140 located between the gate 120 and the substrate 100. By arranging the gate dielectric layer 140, carriers converged in the channel region 112 may be prevented from flowing directly into the gate 120, so that when the gate 120 receives a voltage, carriers converge between the first doped region 111 and the second doped region 113, and thus form a current.

In some embodiments, the semiconductor structure further includes a protective layer 150 covering a top surface and sidewalls of the gate 120. The protective layer 150 is formed to protect the gate 120, so that when the gate 120 is subjected to an external force, the protective layer 150 absorbs a part of stress actions, thereby reducing the stress applied on the gate 120, and thus improving reliability of the semiconductor structure. By arranging the protective layer 150, the gate 120 may also be isolated from an external environment, thereby preventing the gate 120 from being oxidized due to contacting between the gate 120 and air, and thus improving reliability of the semiconductor structure.

In the embodiments of the disclosure, by forming a gate 120 having at least two second conductive portions 122, and by arranging the second conductive portions 122 to be located below an upper surface of the substrate 100, and by arranging the second conductive portions 122 at intervals along the first direction X, and by arranging a channel region 112 to surround sidewalls and a bottom surface of each of the second conductive portions 122, a length of the channel region 112 may be increased, thereby avoiding the problem that the threshold voltage decreases due to too short length of the channel region 112, and thus improving reliability of the semiconductor structure.

Another embodiment of the disclosure further provides a method for manufacturing a semiconductor structure, which may be used to form the above-described semiconductor structure. The method for manufacturing the semiconductor structure provided by another embodiment of the disclosure will be described below with reference to the drawings. It should be noted that contents identical to or corresponding to the foregoing embodiments may refer to corresponding descriptions of the foregoing embodiments, and will not be elaborated below.

Referring to FIG. 4 to FIG. 9 and FIG. 1, the method for manufacturing the semiconductor structure includes the following operations. A substrate 100 is provided, the substrate 100 has an active region 110, and the active region 110 includes a first doped region 111, a channel region 112 and a second doped region 113 arranged along a first direction X. A gate 120 is formed, the gate 120 includes a first conductive portion 121 and at least two second conductive portions 122, the second conductive portions 122 are contacted with and connected to the first conductive portion 121, the first conductive portion 121 is located above the substrate 100, the second conductive portions 122 are located below an upper surface of the substrate 100, adjacent second conductive portions 122 are arranged at intervals along the first direction X, and the channel region 112 surrounds sidewalls and a bottom surface of each of the second conductive portions 122. By forming the second conductive portions 122 located below the upper surface of the substrate 100 and arranging the second conductive portions 122 at intervals along the first direction X, the length of the channel region 112 surrounding the second conductive portions 122 may be increased, thereby avoiding too short length of the channel region due to size shrinkage of the semiconductor structure, and thus improving reliability of the semiconductor structure.

Figure 4:
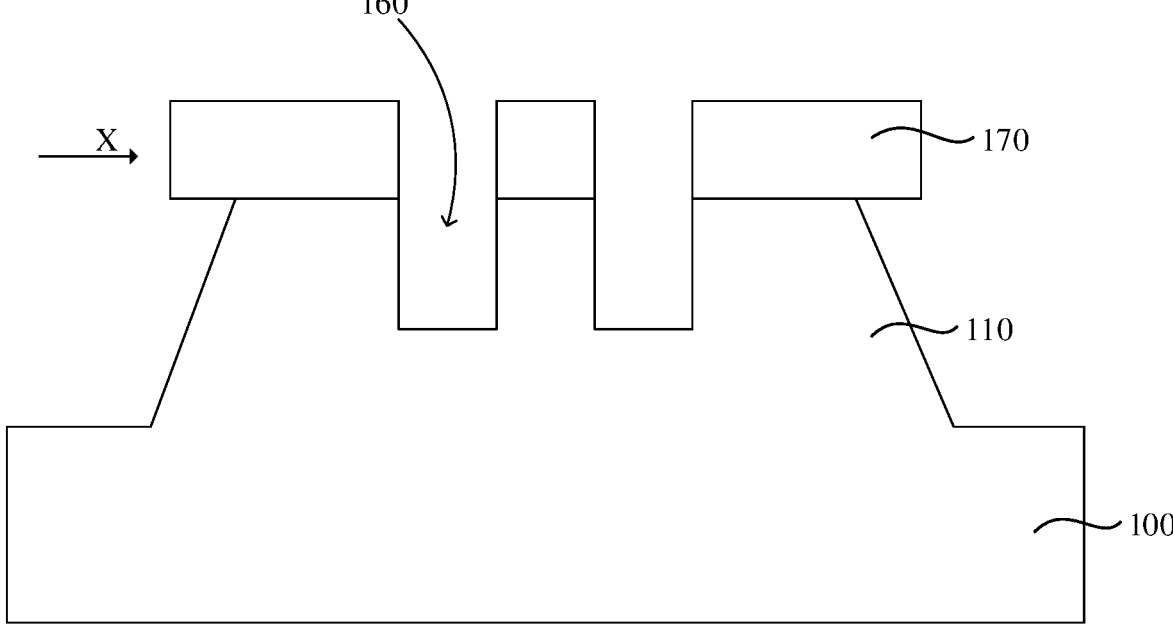
FIG. 4 to FIG. 9 are schematic structural diagrams corresponding to each operation of a method for manufacturing a semiconductor structure provided by an embodiment of the disclosure.

Specifically, referring to FIG. 4, the operation of forming the gate includes the following operations. The active region 110 is patterned to form spaced grooves 160 in the active region 110.

In some embodiments, the grooves 160 may be formed in a mask etching manner. The grooves 160 are formed by forming a first mask layer 170 on a top surface of the active region 110 and etching the active region 110 by using the first mask layer 170 as a mask. In some embodiments, the material of the first mask layer 170 may be a photoresist or the like.

Figure 5:
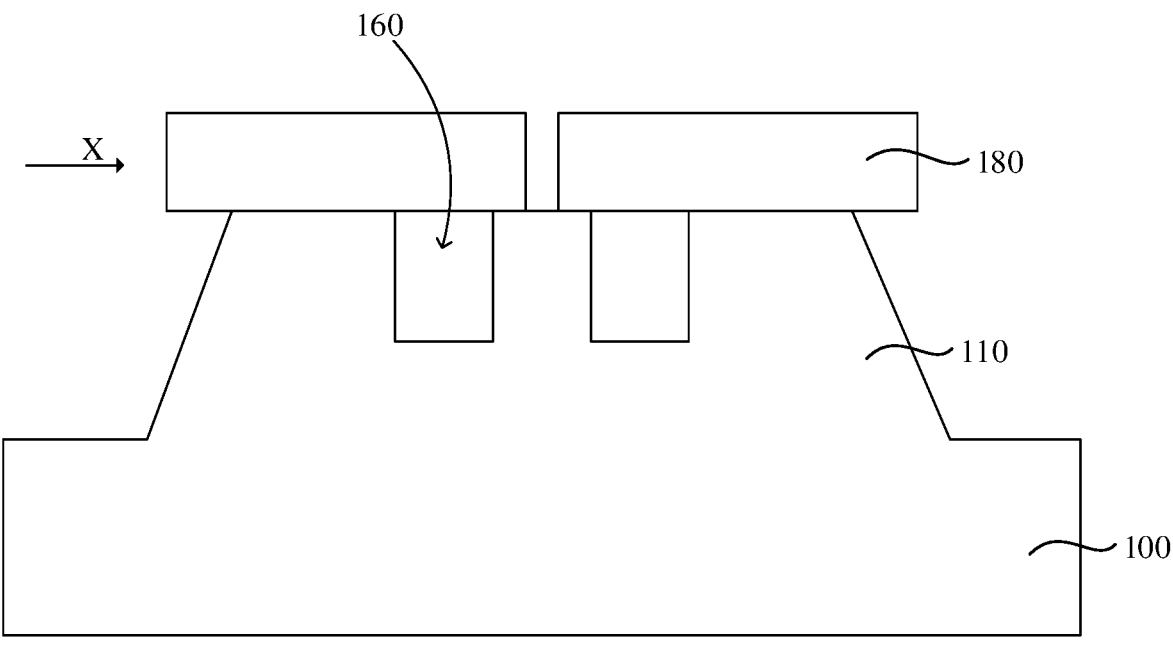
Figure 6:
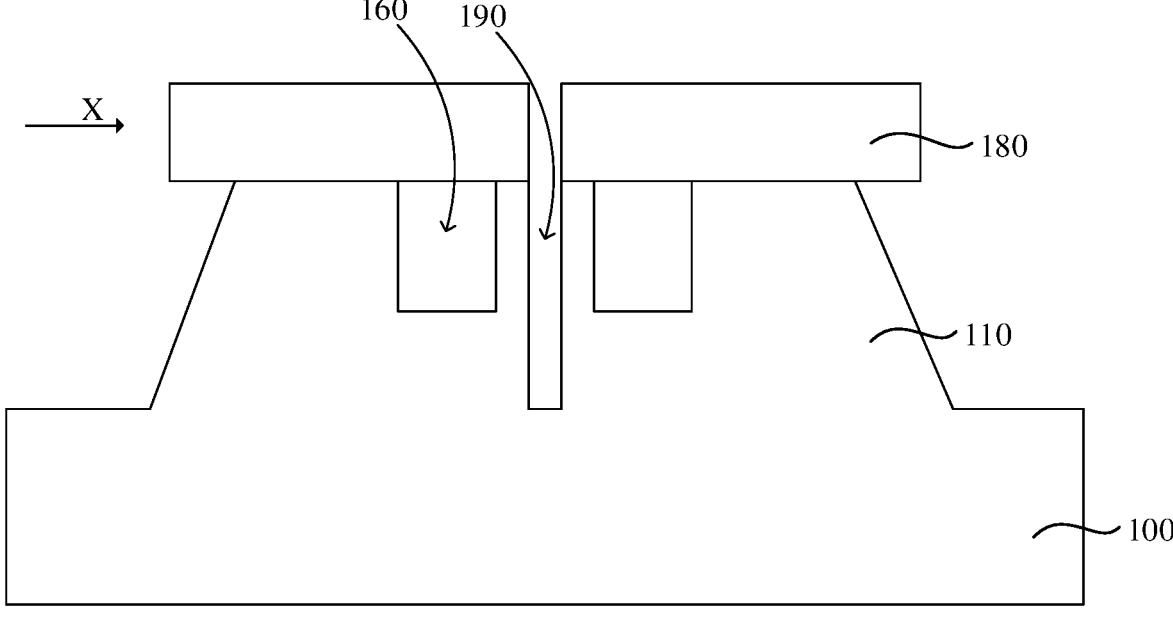
Figure 7:
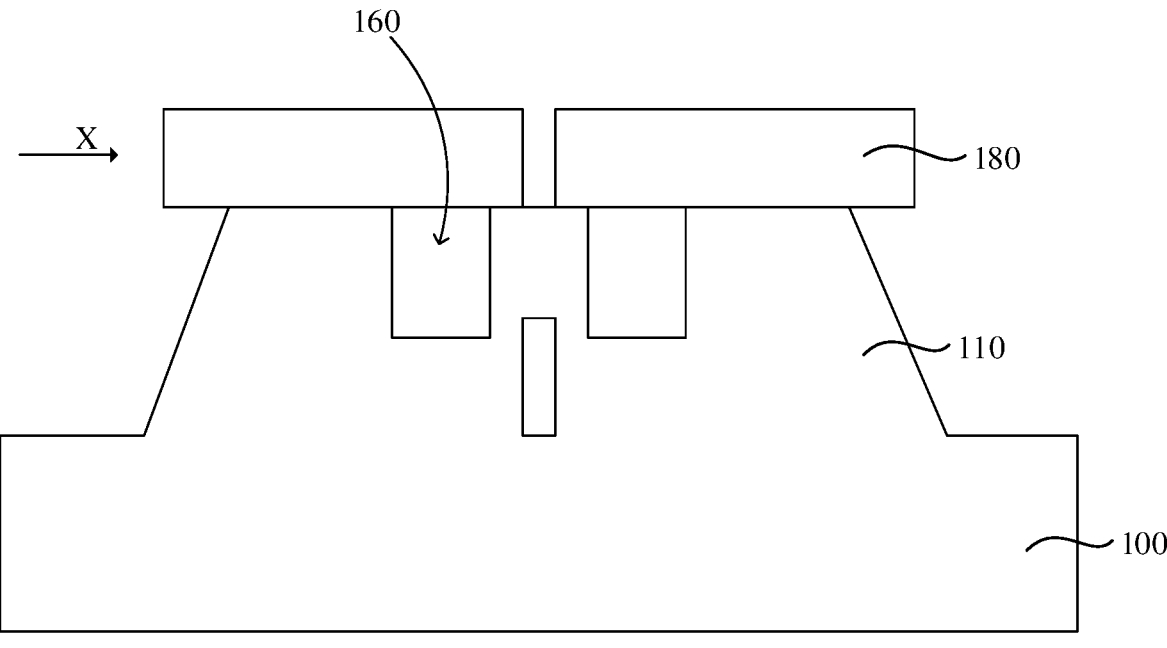

Referring to FIG. 5 to FIG. 7, the method for manufacturing the semiconductor structure further includes the following operations before forming the gate 120. An insulating structure 130 is formed, the insulating structure 130 is located in the active region 110.

Referring to FIG. 5, a second mask layer 180 is formed. The second mask layer 180 is formed to provide a process basis for subsequent formation of the insulating structure.

In some embodiments, the method for manufacturing the semiconductor structure further includes the following operations before forming the second mask layer 180. The first mask layer 170 is removed.

In some embodiments, material of the second mask layer 180 may be the same as that of the first mask layer 170.

Referring to FIG. 6, the active region 110 is etched by using the second mask layer 180 as a mask to form a second groove 190. The second groove 190 is formed to provide a process basis for subsequent formation of the insulating structure, and the second groove 190 is formed to provide a process basis for subsequent deposition of insulating material to form the insulating structure.

Referring to FIG. 7, the insulating structure 130 is formed. The method for manufacturing the semiconductor structure further includes the following operations after forming the insulating structure 130. By adopting an epitaxial growth manner, the same material as material of the active region is grown on the top surface of the insulating structure 130 and sidewalls of the active region 110 exposed by the second groove 190 (refer to FIG. 6), and fills the second groove 190 (refer to FIG. 6). Taking the material of the active region 110 being silicon as an example, silicon may be grown on the sidewalls of the active region 110 exposed by the second groove 190 (refer to FIG. 6) until the second groove 190 is filled (refer to FIG. 6). By forming the insulating structure 130, the length of the channel region may be increased, thereby avoiding the problem that the threshold voltage decreases due to too short length of the channel region, and thus improving reliability of the semiconductor structure.

In some embodiments, material of the insulating structure 130 may be insulating material such as silicon oxide, silicon nitride, or the like.

Figure 8:
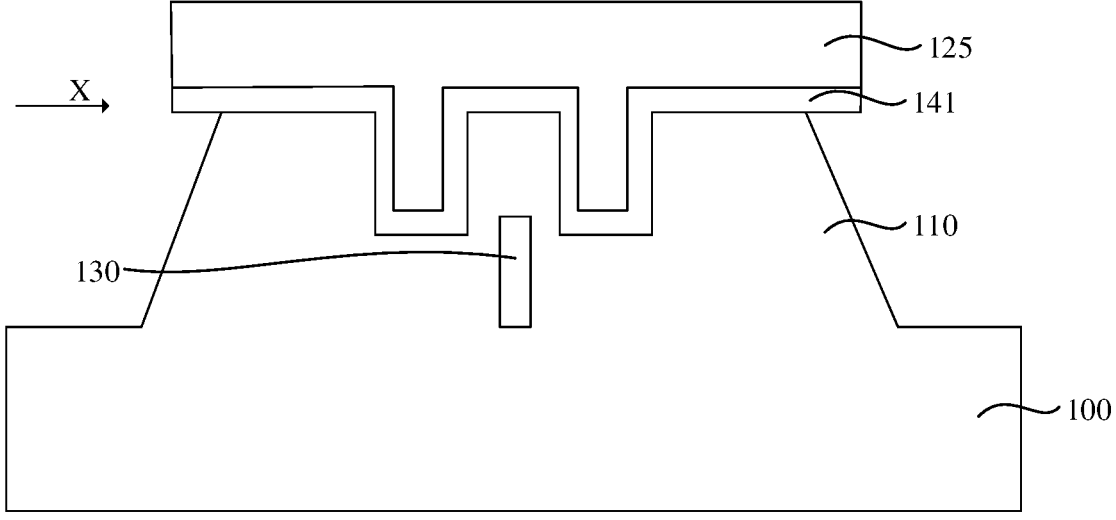
Figure 9:
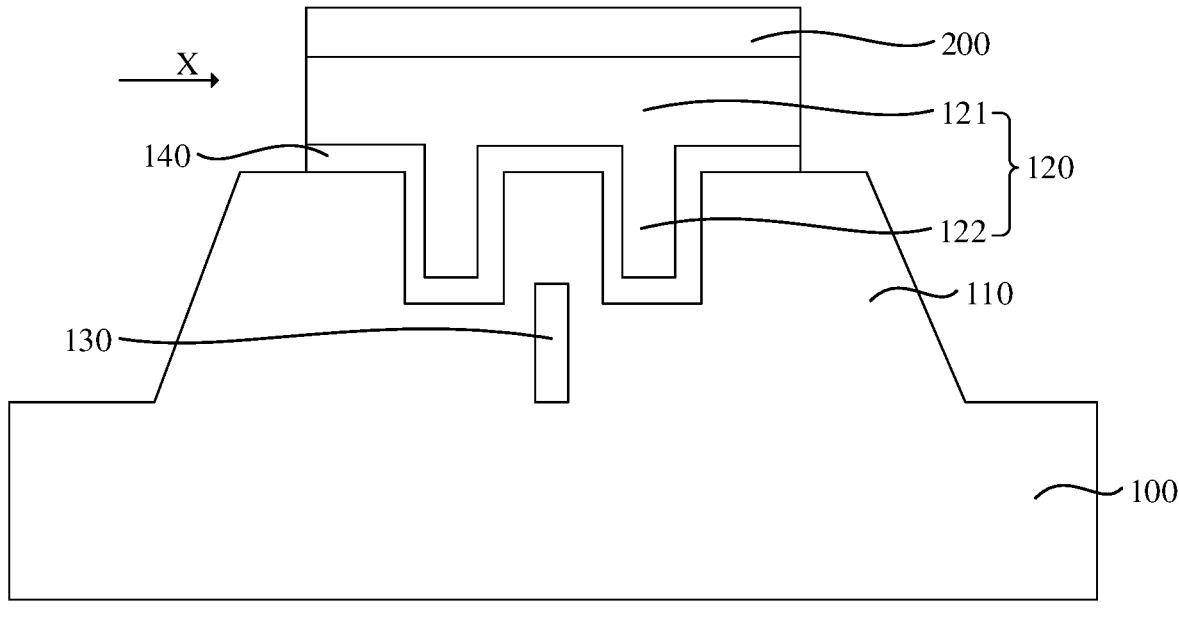

Referring to FIG. 8 and FIG. 9, the gate 120 is formed, so that the second conductive portion 122 fills the groove 160 (refer to FIG. 7), and the first conductive portion 121 is located on a surface of the active region 110. By forming the second conductive portion 122 to fill the groove 160 (refer to FIG. 7), a facing area between the gate 120 and the active region 110 may be increased, that is to say, the length of the channel region may be increased, thereby avoiding the problem that the threshold voltage decreases due to too short length of the channel region, and thus improving reliability of the semiconductor structure.

Referring to FIG. 8, an initial gate 125 is formed. The initial gate 125 covers the entire surface of the active region 110. In some embodiments, the method for manufacturing the semiconductor structure further includes the following operations before forming the initial gate 125. The second mask layer 180 is removed.

In some embodiments, the method for manufacturing the semiconductor structure further includes the following operations before forming the initial gate 125. An initial gate dielectric layer 141 is formed. The initial gate dielectric layer 141 is located between the initial gate 125 and the active region 110. The initial gate 125 and the initial gate dielectric layer 141 may be formed to provide a process basis for subsequent patterning to form the gate and the gate dielectric layer with a desired width.

Referring to FIG. 9, a third mask layer 200 is formed, and the initial gate 125 and the initial gate dielectric layer 141 are patterned by using the third mask layer 200 as a mask to form the gate 120 and the gate dielectric layer 140. Material of the third mask layer 200 may be the same as that of the second mask layer 180.

Referring to FIG. 1, ion implantation is performed on the active region 110 to form the first doped region 111, the channel region 112 and the second doped region 113 arranged along the first direction X. In other embodiments, ion implantation may also be performed on the active region 110 prior to formation of the groove 160, to form the first doped region 111, the channel region 112 and the second doped region 113.

In some embodiments, the method for manufacturing the semiconductor structure further includes the following operations. A protective layer 150 is formed on a surface of the gate 120. In some embodiments, the protective layer 150 may be formed on a top surface of the gate 120, and then the protective layer 150 may be formed again on sidewalls of the gate 120 and sidewalls of the protective layer 150 on the top surface of the gate 120. By forming the protective layer 150, the stress applied on the gate 120 may be reduced, and the gate 120 may be isolated from an external environment, thereby preventing contacting between the gate 120 and the external environment, and thus avoiding oxidation of the gate 120.

In some embodiments, the method of forming the protective layer 150 may be achieved in an atomic layer deposition manner. The protective layer 150 with better uniformity may be formed in an atomic layer deposition manner.

In the embodiments of the disclosure, by forming the second conductive portions 122 located below the upper surface of the substrate 100, and by arranging the second conductive portions 122 at intervals along the first direction X, the length of the channel region 112 surrounding the second conductive portions 122 may be increased, thereby avoiding too short length of the channel region due to size shrinkage of the semiconductor structure, which improves the reliability of the semiconductor structure.

Those of ordinary skill in the art will appreciate that the above-described embodiments are specific embodiments implementing the disclosure, and in practical applications, various changes in form and detail may be made thereto without departing from the spirit and scope of the embodiments of the disclosure. Any person skilled in the art may make their own changes and modifications without departing from the spirit and scope of the embodiments of the disclosure, thus the scope of protection of the embodiments of the disclosure shall be subject to the scope defined in the claims.

The invention claimed is:

1. A semiconductor structure, comprising:
a substrate having an active region which comprises a first doped region, a channel region and a second doped region arranged along a first direction; and
a gate comprising a first conductive portion and at least two second conductive portions contacted with and connected to the first conductive portion, the first conductive portion located above an upper surface of the substrate, the second conductive portions located below the upper surface of the substrate, adjacent second conductive portions arranged at intervals along the first direction, and the channel region surrounding sidewalls and a bottom surface of each of the second conductive portions; and
an insulating structure located in the active region and located between the adjacent second conductive portions; and
a projection of the first conductive portion on a surface of the substrate partially coincides with a projection of the first doped region on the surface of the substrate and partially coincides with a projection of the second doped region on the surface of the substrate, and a projection of each of the second conductive portions on the surface of the substrate is located between the projection of the first doped region on the surface of the substrate and the projection of the second doped region on the surface of the substrate.

2. The semiconductor structure of claim 1, wherein along the first direction, a width of each of the second conductive portions is identical.

3. The semiconductor structure of claim 1, wherein in a direction perpendicular to a surface of the substrate, heights of several of the second conductive portions are identical.

4. The semiconductor structure of claim 1, wherein along the first direction, heights of several of the second conductive portions are sequentially increased.

5. The semiconductor structure of claim 1, wherein along the first direction, widths of the adjacent second conductive portions are sequentially decreased.

6. The semiconductor structure of claim 4, wherein along the first direction, widths of the adjacent second conductive portions are sequentially decreased.

7. The semiconductor structure of claim 1, wherein in a direction perpendicular to a surface of the substrate, a height of each of the second conductive portions is identical to a height of a corresponding part of the first conductive portion contacted with the second conductive portion.

8. The semiconductor structure of claim 1, wherein along the first direction, a width of the insulating structure is less than or equal to one-third of a spacing between the second conductive portions.

9. The semiconductor structure of claim 1, wherein in a direction perpendicular to a surface of the active region, a spacing between a top surface of the insulating structure and the first conductive portion is greater than or equal to one-fifth of a thickness of each of the second conductive portions.

10. The semiconductor structure of claim 1, wherein the insulating structure located between the adjacent second conductive portions comprises a plurality of insulating structures arranged at intervals.

11. The semiconductor structure of claim 10, wherein each of the second conductive portions comprises a first sub-conductive portion and a second sub-conductive portion, the first sub-conductive portions are arranged in the substrate at intervals, the second sub-conductive portion is located between adjacent first sub-conductive portions and is also located between adjacent insulating structures, and along the first direction, a width of the first sub-conductive portion is greater than that of the second sub-conductive portion, and a bottom surface of the second sub-conductive portion is lower than a top surface of the insulating structure.

12. The semiconductor structure of claim 1, further comprising: a gate dielectric layer located between the gate and the substrate.

13. The semiconductor structure of claim 1, further comprising: a protective layer covering a top surface and sidewalls of the gate.

* * * * *